(12) United States Patent
Reed et al.

(10) Patent No.: US 8,287,648 B2
(45) Date of Patent: Oct. 16, 2012

(54) METHOD AND APPARATUS FOR MINIMIZING CONTAMINATION IN SEMICONDUCTOR PROCESSING CHAMBER

(75) Inventors: Joseph C Reed, Chandler, AZ (US); Eric J Shero, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 769 days.

(21) Appl. No.: 12/368,081

(22) Filed: Feb. 9, 2009

(65) Prior Publication Data

US 2010/0202860 A1  Aug. 12, 2010

(51) Int. Cl.
  *C23C 16/00* (2006.01)
  *B05C 11/00* (2006.01)
  *B65H 1/00* (2006.01)

(52) U.S. Cl. ........ 118/719; 118/729; 118/733; 118/663; 414/222.02; 414/805

(58) Field of Classification Search .................. 118/719, 118/729, 733, 663; 414/222.02, 805
See application file for complete search history.

(56) References Cited

U.S. PATENT DOCUMENTS

| | | | |
|---|---|---|---|
| 4,828,224 A | 5/1989 | Crabb et al. |
| 4,889,609 A | 12/1989 | Cannella |
| 5,186,718 A | 2/1993 | Tepman et al. |
| 5,286,296 A | 2/1994 | Sato et al. |
| 5,435,682 A | 7/1995 | Crabb et al. |
| 5,586,585 A | 12/1996 | Bonora et al. |
| 5,601,686 A | 2/1997 | Kawamura et al. |
| 5,609,689 A | 3/1997 | Kato et al. |
| 5,611,655 A | 3/1997 | Fukasawa et al. |
| 5,647,945 A | 7/1997 | Matsuse et al. |
| 5,651,868 A | 7/1997 | Canady et al. |
| 5,784,799 A | 7/1998 | Kato et al. |

(Continued)

FOREIGN PATENT DOCUMENTS

JP  1992-100222  4/1992

(Continued)

OTHER PUBLICATIONS

Search Report for International Application No. PCT/US2010/020098 dated Dec. 10, 2010.

(Continued)

*Primary Examiner* — Dah-Wei Yuan
*Assistant Examiner* — Binu Thomas
(74) *Attorney, Agent, or Firm* — Knobbe Martens Olson & Bear LLP

(57) ABSTRACT

A semiconductor processing apparatus includes a reaction chamber, a loading chamber, a movable support, a drive mechanism, and a control system. The reaction chamber includes a baseplate. The baseplate includes an opening. The movable support is configured to hold a workpiece. The drive mechanism is configured to move a workpiece held on the support towards the opening of the baseplate into a processing position. The control system is configured to create a positive pressure gradient between the reaction chamber and the loading chamber while the workpiece support is in motion. Purge gases flow from the reaction chamber into the loading chamber while the workpiece support is in motion. The control system is configured to create a negative pressure gradient between the reaction chamber and the loading chamber while the workpiece is being processed. Purge gases can flow from the loading chamber into the reaction chamber while the workpiece support is in the processing position, unless the reaction chamber is sealed from the loading chamber in the processing position.

19 Claims, 8 Drawing Sheets

U.S. PATENT DOCUMENTS

| | | | |
|---|---|---|---|
| 5,785,796 A | 7/1998 | Lee | |
| 5,788,778 A | 8/1998 | Shang et al. | |
| 5,810,942 A | 9/1998 | Narayanswami et al. | |
| 5,820,692 A | 10/1998 | Baecker et al. | |
| 5,844,195 A | 12/1998 | Fairbairn et al. | |
| 5,879,574 A | 3/1999 | Sivaramakrishnan et al. | |
| 5,913,978 A | 6/1999 | Kato et al. | |
| 5,934,856 A | 8/1999 | Asakawa et al. | |
| 5,981,399 A | 11/1999 | Kawamura et al. | |
| 5,997,588 A | 12/1999 | Goodwin et al. | |
| 6,042,623 A | 3/2000 | Edwards | |
| 6,048,154 A | 4/2000 | Wytman | |
| 6,106,634 A | 8/2000 | Ghanayem et al. | |
| 6,158,946 A * | 12/2000 | Miyashita | 414/411 |
| 6,224,312 B1 | 5/2001 | Sundar | |
| 6,224,679 B1 | 5/2001 | Sasaki et al. | |
| 6,286,230 B1 | 9/2001 | White et al. | |
| 6,312,525 B1 | 11/2001 | Bright et al. | |
| 6,409,837 B1 | 6/2002 | Hillman | |
| 6,488,778 B1 | 12/2002 | Ballantine et al. | |
| 6,536,136 B2 | 3/2003 | Saga | |
| 6,562,140 B1 | 5/2003 | Bondestam et al. | |
| 6,828,235 B2 | 12/2004 | Takano | |
| 6,875,280 B2 | 4/2005 | Ikeda et al. | |
| 6,899,507 B2 | 5/2005 | Yamagishi et al. | |
| 7,020,981 B2 | 4/2006 | Shero et al. | |
| 7,021,881 B2 | 4/2006 | Yamagishi et al. | |
| 7,022,613 B2 | 4/2006 | Pomarede et al. | |
| 7,276,123 B2 | 10/2007 | Shimizu et al. | |
| 2001/0000759 A1 | 5/2001 | Doley et al. | |
| 2002/0020344 A1 | 2/2002 | Takano | |
| 2003/0198741 A1 | 10/2003 | Uchida et al. | |
| 2003/0230322 A1 | 12/2003 | Hillman et al. | |
| 2004/0144311 A1 | 7/2004 | Chen et al. | |
| 2004/0144400 A1 | 7/2004 | Satoh et al. | |
| 2004/0166697 A1 | 8/2004 | Wang et al. | |
| 2004/0255985 A1 | 12/2004 | Xia et al. | |
| 2005/0022737 A1 | 2/2005 | Shimizu et al. | |
| 2005/0054196 A1 | 3/2005 | Wu et al. | |
| 2005/0268856 A1 * | 12/2005 | Miller et al. | 118/729 |
| 2006/0105548 A1 | 5/2006 | Kudo et al. | |
| 2006/0107970 A1 | 5/2006 | Verhaverbeke | |
| 2006/0130761 A1 * | 6/2006 | Sakai | 118/719 |
| 2007/0116873 A1 * | 5/2007 | Li et al. | 118/719 |
| 2010/0173432 A1 * | 7/2010 | White et al. | 118/729 |

FOREIGN PATENT DOCUMENTS

| | | |
|---|---|---|
| JP | 1992-118925 | 4/1992 |
| JP | 05-275519 | 10/1993 |
| JP | 07-142391 | 6/1995 |
| JP | 1995-211761 | 8/1995 |
| JP | 07-273092 | 10/1995 |
| JP | 07-283147 | 10/1995 |
| JP | 1998-270527 | 10/1998 |
| JP | 1999-288992 | 10/1999 |
| JP | 11-330064 | 11/1999 |
| JP | 2003-059997 | 2/2003 |
| WO | WO 01/04935 | 1/2001 |

OTHER PUBLICATIONS

European Office Action issued May 4, 2007 in counterpart European Patent Application No. 03 731 267.8.

Japanese Office Action issued Mar. 25, 2009 in counterpart Japanese Patent Application No. 2004-508393.

IPRP for International Application No. PCT/US2010/020098 dated Aug. 9, 2011.

Office Action for U.S. Appl. No. 12/350,793 dated Sep. 2, 2011.

Final Office Action for U.S. Appl. No. 12/350,793, dated Mar. 12, 2012, filed Jan. 8, 2009.

* cited by examiner

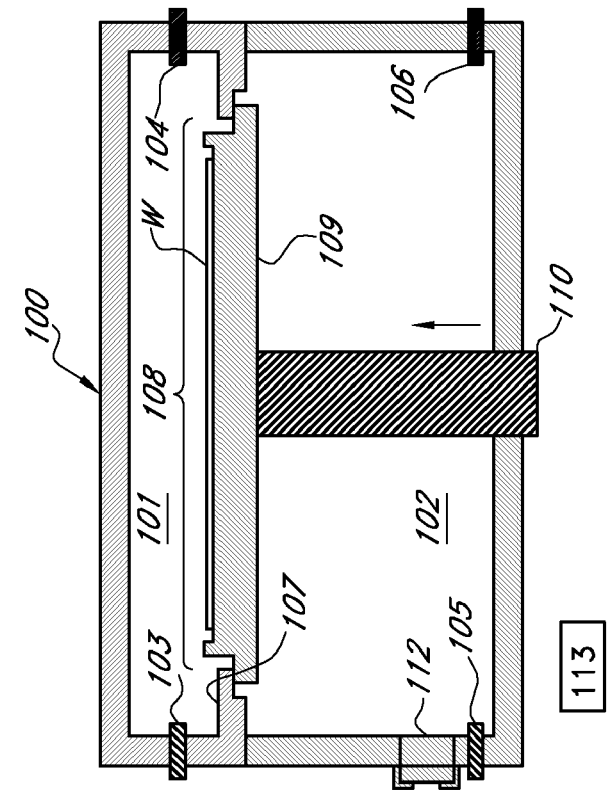
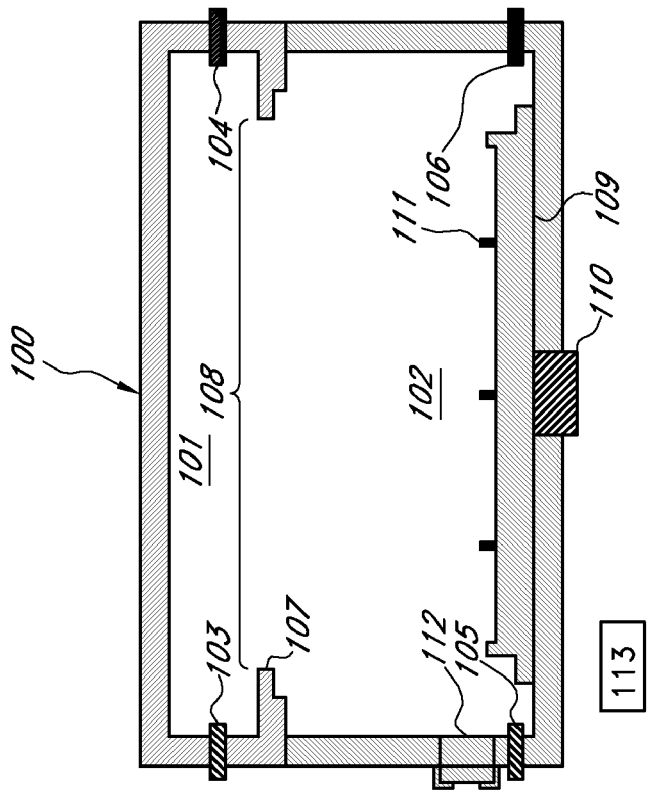

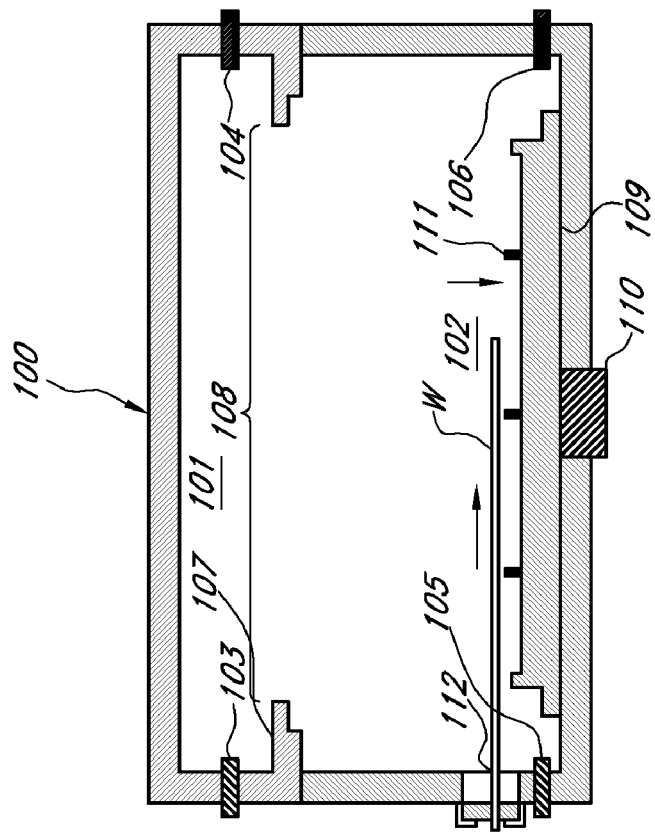
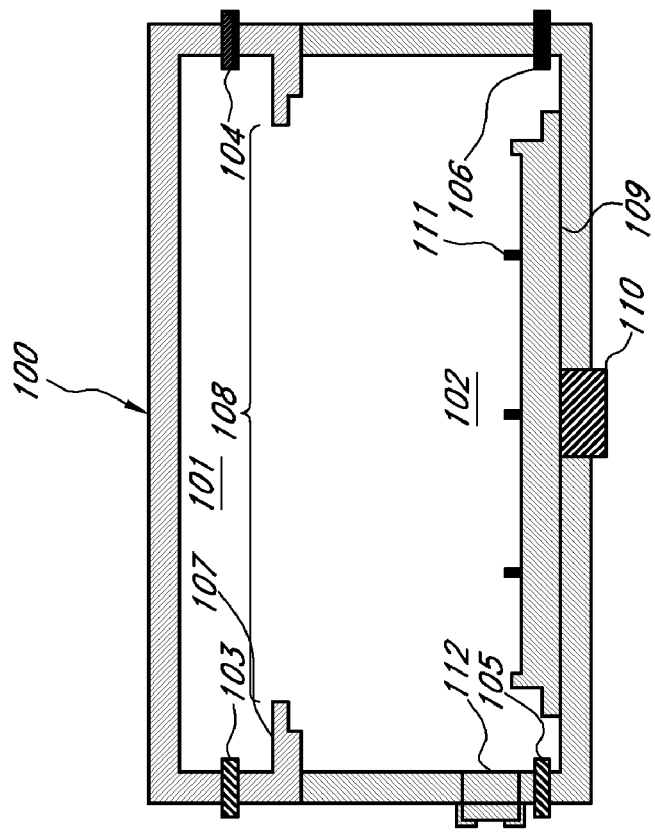

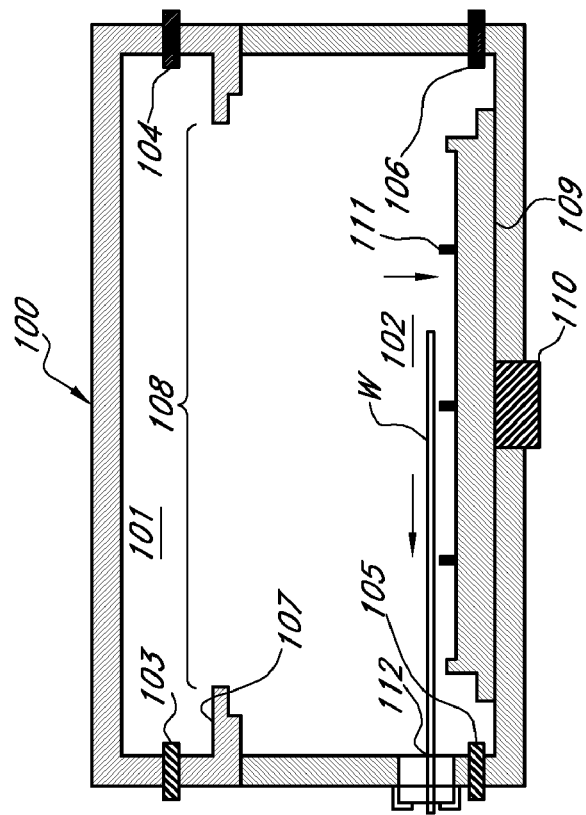
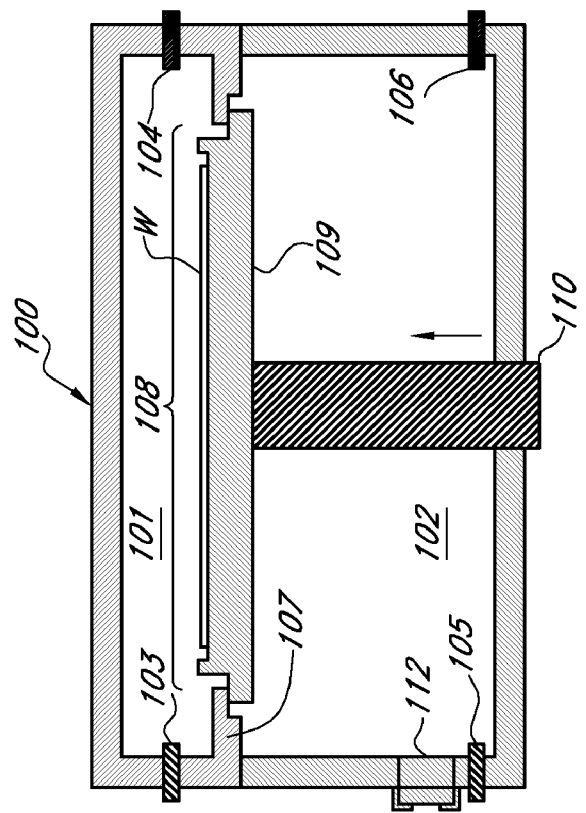

| | Reaction Chamber Gas Flow | Reaction Chamber Outlet | Reaction Chamber Pressure | Loading Chamber Purge Gas Flow | Loading Chamber Outlet | Loading Chamber Pressure | Net Gas Flow Into | Chamber With Greater Pressure | Support Position |
|---|---|---|---|---|---|---|---|---|---|
| Initial State | 1 slm | Connected to Suction | < 1 Torr | Variable (Maintain 1 Torr) | Isolated | 1 Torr | Reaction Chamber | Loading Chamber | Loading Position |
| Open Gate Valve | 1 slm | Connected to Suction | < 3 Torr | Variable (Maintain 1 Torr) | Isolated | 3 Torr | Reaction Chamber | Loading Chamber | Loading Position |
| Closed Gate Valve | 1 slm | Connected to Suction | < 1 Torr | Variable (Maintain 1 Torr) | Isolated | 1 Torr | Reaction Chamber | Loading Chamber | Loading Position |
| Establish Positive Pressure Gradient | 1 slm | Connected to Suction | 1.3 Torr | 0 slm | Connected (Strong) | < 1 Torr | Loading Chamber | Reaction Chamber | Loading Position |
| Raise Support | 1 slm | Connected to Suction | 3 Torr | 0 slm | Connected (Strong) | < 1 Torr | Loading Chamber | Reaction Chamber | Loading Position |
| Establish Negative Pressure Gradient | 1 slm | Connected to Suction | 3 Torr | 150 sccm | Connected (Weak) | 4 Torr | Reaction Chamber | Loading Chamber | Processing Position |
| Start Processing | 1.3 slm | Connected to Suction | 3.5 Torr | 150 sccm | Connected (Weak) | 4 Torr | Reaction Chamber | Loading Chamber | Processing Position |
| Establish Positive Pressure Gradient | 1 slm | Connected to Suction | 3 Torr | 0 slm | Connected (Strong) | < 1 Torr | Loading Chamber | Reaction Chamber | Processing Position |
| Lower Support | 1 slm | Connected to Suction | 1.3 Torr | 0 slm | Connected (Strong) | < 1 Torr | Loading Chamber | Reaction Chamber | Loading Position |

FIG. 9

METHOD AND APPARATUS FOR MINIMIZING CONTAMINATION IN SEMICONDUCTOR PROCESSING CHAMBER

BACKGROUND OF THE INVENTION

1. Field of the Invention

The present invention relates to systems and methods for handling substrates for semiconductor processing.

2. Description of the Related Art

In the processing of semiconductor devices, such as transistors, diodes, and integrated circuits, a plurality of such devices are typically fabricated simultaneously on a thin slice of semiconductor material, termed a substrate, wafer, or workpiece. When manufacturing such semiconductor devices, it is desirable that workpieces do not become contaminated by particulates, which may lead to device failure. Accordingly, reactors in which workpieces are processed are isolated from the exterior of the reaction space to prevent contamination from entering the reaction space.

BRIEF SUMMARY OF THE INVENTION

According to one embodiment, a semiconductor processing apparatus includes a cross-flow reaction chamber located above a loading chamber, separated by a baseplate that has an opening. A movable workpiece support is configured to hold a semiconductor workpiece. A drive mechanism is configured to move the workpiece support between a loading position and a processing position. The apparatus also includes a control system configured to control the pressure of the reaction chamber to be higher than that of the loading chamber while the workpiece support is moving.

The control system may be further configured to control the pressure of the reaction chamber to be lower than that of the loading chamber while the workpiece support is in the processing position.

According to one embodiment, a semiconductor processing apparatus includes a reaction chamber located above a loading chamber, separated by a baseplate that has an opening. A movable workpiece support is configured to move between a loading position and a processing position. The workpiece support engages the baseplate opening to create a seal between the workpiece support and the baseplate opening when the workpiece support is in the processing position. The apparatus also includes a control system configured to control the pressure of the reaction chamber to be higher than that of the loading chamber while the workpiece support is moving.

According to one embodiment, a method is provided for processing a semiconductor workpiece in a semiconductor processing apparatus that includes a cross-flow reaction chamber located above a loading chamber, separated by a baseplate that has an opening. The method includes loading the semiconductor workpiece onto a moveable workpiece support when the support is in a loading position. The workpiece support is moved between the loading position and a processing position. Higher pressure is maintained in the reaction chamber than in the loading chamber while the workpiece support is moving. The workpiece is processed after the workpiece support is moved to the processing position, wherein processing comprises flowing a reaction gas approximately parallel to a face of the workpiece.

The method of processing a semiconductor workpiece may further include maintaining a lower pressure in the reaction chamber than in the loading chamber during processing.

According to one embodiment, a method is provided for processing a workpiece in a semiconductor processing apparatus that includes a reaction chamber located above a loading chamber, separated by a baseplate that has an opening. The method includes loading a semiconductor workpiece onto a moveable workpiece support when the support is in a loading position. The workpiece support is moved between the loading position and a processing position. A seal is created between the workpiece support and the baseplate opening when the workpiece support is in the processing position. Gas is flowed from the reaction chamber into the loading chamber while the workpiece support is moving.

The method of processing a workpiece in a semiconductor processing apparatus may further include flowing gas from the loading chamber into the reaction chamber when the workpiece support is in the processing position.

In the above embodiments, the workpiece support may engage the baseplate opening when the workpiece support is in the processing position. Engaging may include maintaining a gap between the baseplate and the workpiece support. In other arrangements, engaging may create a seal between the baseplate and the workpiece support.

For purposes of summarizing the invention and the advantages achieved over the prior art, certain objects and advantages of the invention have been described herein above. It is to be understood that not all such objects or advantages may necessarily be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached drawings, the invention not being limited to any particular embodiment(s) disclosed.

BRIEF DESCRIPTION OF THE DRAWINGS

These and other features, aspects, and advantages of the invention disclosed herein are described below with reference to the drawings of certain embodiments, which are intended to illustrate and not to limit the invention.

FIG. 1 schematically illustrates a cross-section of a semiconductor processing apparatus with a workpiece support in a loading position, according to one embodiment.

FIG. 2 schematically illustrates the apparatus of FIG. 1 with the workpiece support shown in a processing position, according to one embodiment.

FIGS. 5A-5D are schematic cross-sections illustrating a method of processing a workpiece in the apparatus of FIG. 1, according to one embodiment.

FIG. 9 is a chart illustrating the status of a semiconductor processing apparatus during various stages of workpiece processing, according to an example of the process of FIG. 8.

DETAILED DESCRIPTION

Figure 4A:
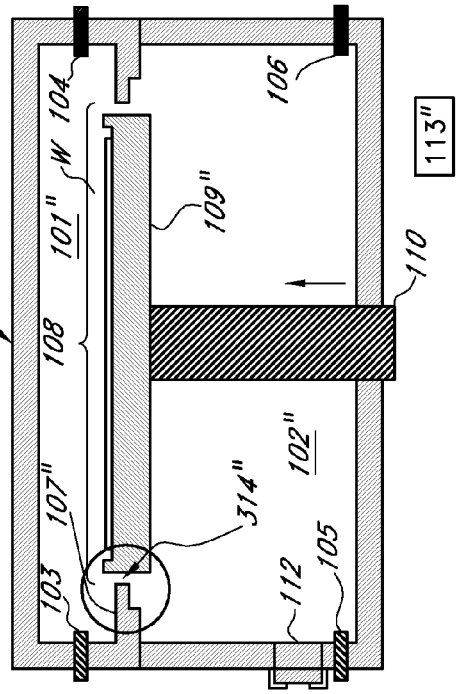
FIG. 4A schematically illustrates a cross-section of a semiconductor processing apparatus with the workpiece support shown in the processing position, according to another embodiment.

Although certain embodiments and examples are disclosed below, it will be understood by those having ordinary skill in the art that the invention extends beyond the specifically disclosed embodiments and/or uses of the invention and obvious modifications and equivalents thereof. Thus, it is intended that the scope of the invention herein disclosed should not be limited by the particular disclosed embodiments described below.

In General

FIG. 1 schematically illustrates an embodiment of a semiconductor processing apparatus 100 comprising a reaction chamber 101 and a loading chamber 102. Together, the reaction chamber 101 and the loading chamber 102 may be considered a process module. In the illustrated embodiment, the reaction chamber 101 is disposed above the loading chamber 102, and they are separated by a baseplate 107 and a movable pedestal or workpiece support 109, described in more detail below.

In some embodiments, the reaction chamber 101 may be substantially smaller than the loading chamber 102, contrary to the schematic drawings, which are not drawn to scale. For a single wafer process module, as shown, the reaction chamber 101 may have a volume between about 0.25 liters and 3 liters. In some embodiments, the reaction chamber 101 may have a volume of less than about 1 liter. In some embodiments, the reaction chamber 101 may be about 900 mm long, 600 mm wide, and 5 mm high. In some embodiments, the loading chamber 102 may have a volume between about 30 liters and about 50 liters. In some embodiments, the loading chamber 102 may have a volume of about 40 liters. In some embodiments, the loading chamber 102 may have a volume about 35-45 times the volume of the reaction chamber 101. An example of a suitable apparatus for modifying to meet the description below is the P3000™ or PULSAR 3000™, commercially available from ASM America, Inc. of Phoenix, Ariz.

In some embodiments, the reaction chamber 101 may comprise one or more inlets 103 (one shown) and one or more outlets 104 (one shown). During processing, gases such as reactants and purge gases may flow into the reaction chamber 101 through the reaction chamber inlet 103, and gases such as excess reactants, reactant byproducts, and purge gases may flow out of the reaction chamber 101 through the reaction chamber outlet 104. In some embodiments, the loading chamber 102 may comprise one or more inlets 105 (one shown) and one or more outlets 106 (one shown). In operation, gases such as purge gases may flow into the loading chamber 102 through the loading chamber inlet 105, and gases such as excess reactants, reactant byproducts, and purge gases may flow out of the loading chamber 102 through the loading chamber outlet 106. The depicted configuration, such as the positions of the inlets 103, 105 and outlets 104, 106 are merely schematic, and may be adjusted based on, for example, the process to be performed in the reaction chamber 101, the desired flow path of the gases, etc.

In the illustrated embodiment, the reaction chamber 101 comprises a baseplate 107 including an opening 108. An interior edge of the baseplate 107 defines the opening 108. In some embodiments, the baseplate 107 may comprise titanium. In the illustrated embodiment, the reaction chamber inlet 103 is located approximately opposite to the reaction chamber outlet 104, such that reaction gas that flows from the reaction chamber inlet 103 to the reaction chamber outlet 104 travels approximately parallel to a face of the workpiece W, and thus parallel to the upper surface of the moveable support. Such reactors are sometimes referred to as "cross-flow" or horizontal laminar flow reactors. In some embodiments, apparatus 100 may be an atomic layer deposition (ALD) reactor, such that it includes valves controlled by a control system 113 to separately provide pulses of reactants. In some embodiments, apparatus 100 may include two or more valves independently controlled by control system 113 to allow regulation of relative pressure and/or the direction of flow between reaction chamber 101 and loading chamber 102. In some embodiments, the reaction chamber inlet 103 may comprise a distribution system such to distribute gas in a desirable pattern. In some embodiments, the reaction chamber 101 may taper near the reaction chamber outlet 104, such that the height of the reaction chamber 101 decreases near the reaction chamber outlet 104, thereby constricting air flow through the reaction chamber outlet 104. Although the apparatus 100 may be described herein with respect to vapor deposition (e.g., chemical vapor deposition, or CVD, and/or atomic layer vapor deposition, or ALD) reactors, the apparatus 100 may alternatively comprise other semiconductor processing tools, including, but not limited to, dry etchers, ashers, rapid thermal annealers, etc.

The apparatus 100 further comprises the moveable support 109, configured to be moved between a loading position and a processing position by operation of a drive mechanism 110. FIG. 1 depicts the support 109 in the loading position, according to one embodiment. The support 109 may be configured to hold a semiconductor workpiece W (see FIG. 2), such as a silicon wafer. The workpiece W may be loaded and unloaded into the support 109 in various ways, such as with an end effector of a robot. The support 109 may comprise lift-pins 111 and/or cutouts to aid in loading and unloading of the workpiece W with a paddle or fork. The support 109 may comprise a vacuum system that holds the workpiece W in place after loading, or gravity alone may hold the workpiece W in a pocket that is sized and shaped to accommodate the workpiece W. The apparatus 100 may further comprise one or more gate valves 112 (one shown) for loading and unloading of workpieces W to and from the support 109. The gate valve 112 may allow access to, for example, a transfer chamber, load lock, processing chamber, clean room, etc.

The control system 113 is also configured or programmed to control the drive mechanism 110. In some embodiments, the drive mechanism 110 may comprise a piston or elevator that imparts vertical movement to the support 109. The drive mechanism 110 is therefore configured to move the support 109, and thus the workpiece W disposed on the support 109, into the processing position during a reactor closure operation and into the loading position during a reactor opening operation. The drive mechanism 110 can also configured to rotate the workpiece W disposed on the support 109.

Processing Position

FIG. 2 schematically illustrates the apparatus 100 with the support 109 shown in the processing position, according to one embodiment. When in the processing position, the support 109 engages the baseplate 107, effectively isolating or separating the interior of the reaction chamber 101 from the loading chamber 102. In some embodiments, engaging may comprise creating a hard metal-on-metal seal between the baseplate 107 and the support 109. In some embodiments, engaging may comprise compression of pliable material, such as an O-ring, on either part, to create a soft seal between the baseplate 107 and the support 109. In some embodiments, engaging may comprise maintaining a gap between the support 109 and the baseplate 107, such that there is no absolute seal. Even where engaging comprises maintaining a gap between the support 109 and the baseplate 107, the support may still effectively separate the reaction chamber 101 from the loading chamber 102 by creating a substantial barrier to fluid communication between the reaction chamber 101 and the loading chamber 102.

Gap Maintenance

Figure 3A:
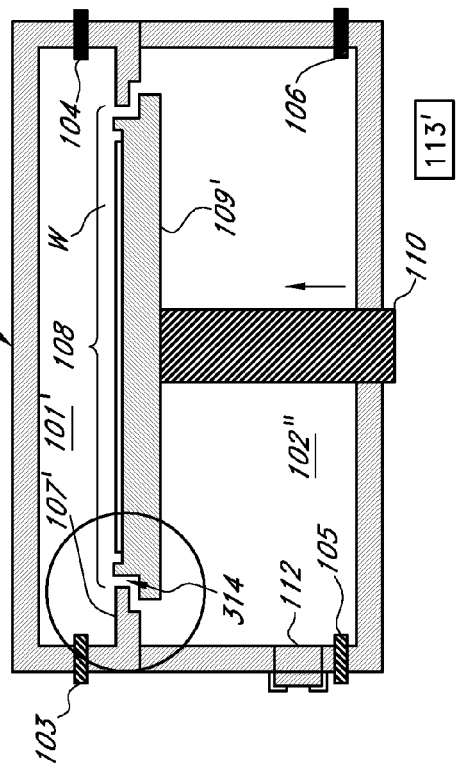
FIG. 3A schematically illustrates a cross-section of a semiconductor processing apparatus with the workpiece support shown in the processing position, according to another embodiment.

FIG. 3A schematically illustrates an example embodiment of a semiconductor processing apparatus 100' comprising a reaction chamber 101' and a loading chamber 102'. The apparatus 100' is similar to the apparatus 100 described above, except that the support 109' and the baseplate 107' may not create a seal when the support 109' is in the processing position. The apparatus 100' may be similar to that described in U.S. patent application Ser. No. 12/350,793, entitled "Gap Maintenance for Opening to Process Chamber" (filed Jan. 8, 2009), the disclosure of which is hereby incorporated by reference for the purpose of describing methods and apparatuses for maintaining a gap between a support and a baseplate when the support is in the processing position.

In the illustrated embodiment, there is a gap 314 between the support 109' and the baseplate 107' when the support 109' is in the processing position. The control system 113' is configured to move the support 109' into engagement with the baseplate 107' for processing of a workpiece W in the reaction chamber 101'.

Figure 3B:
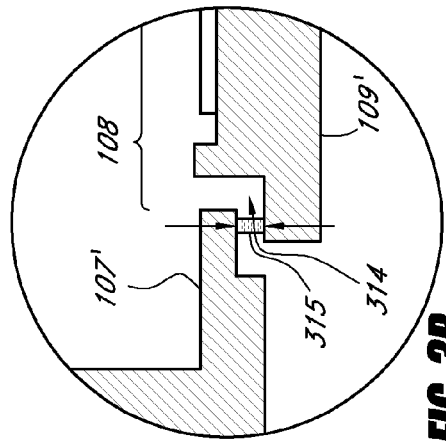
FIG. 3B is an enlarged view of the region B in FIG. 3A.

FIG. 3B illustrates an enlarged view of the gap 314, comprising both horizontal and vertical spacing between parts of the support 109' and the baseplate 107'. In some embodiments, one or more pads 315 may be configured to vertically space the support 109' from the baseplate 107". The pads 315 may be spaced evenly around the perimeter of opening 108, and can be mounted on the underside of the baseplate 107' and/or the upper surface of the support 109'. The pads 315 may be separated in a top-down view, allowing some fluid communication between the reaction chamber 101' and the loading chamber 102' during processing of a workpiece W.

Figure 4B:
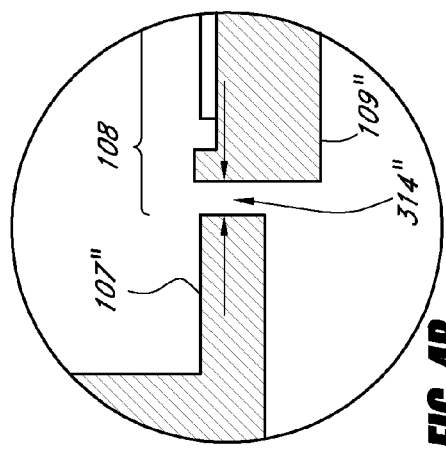
FIG. 4B is an enlarged view of the region B in FIG. 4A.

FIG. 4A schematically illustrates an embodiment of a semiconductor processing apparatus 100". The apparatus 100" may be similar to the apparatus 100' described above, except that the support 109" and the baseplate 107" may be shaped and sized such that the gap 314" comprises an annular horizontal space substantially surrounding the support 109". FIG. 4B illustrates an enlarged view of the gap 314".

Positive Pressure

While the following description refers to the apparatus of FIG. 1, it will be appreciated that the description can be applied to other apparatuses disclosed herein, as well as to other suitable semiconductor workpiece processing apparatuses.

Each time a workpiece W is processed in the reaction chamber 101, particles may be generated as the support 109 engages the baseplate 107. This is a danger regardless of whether engagement involves contact (FIG. 2) or maintaining a gap 314 or 314" (FIGS. 3A-4B). During a typical reactor closure operation, there may be a higher pressure in the loading chamber 102 than in the reaction chamber 101. Gases may therefore flow from the loading chamber 102 into the reaction chamber 101 through the opening 108 as the support 109 moves towards the baseplate 107. As the support 109 moves towards engagement with the baseplate 107, the gap between the support 109 and the baseplate 107 narrows, and the support 109 may increasingly restrict gas flow through the opening 108. The increasingly restricted gas flow through the opening 108 may exacerbate the pressure differential between the reaction chamber 101 and the loading chamber 102, causing gas to flow at a higher speed through the narrowing gap between the support 109 and the baseplate 107. As the gap between the support 109 and the baseplate 107 narrows further, the increasing speed of gas may cause particles to dislodge from nearby swept surfaces and be carried into the reaction chamber 101. These particles may comprise many different materials, such as particles from the material of reaction chamber 101 parts, and/or materials deposited during the processing within reaction chamber 101. Accordingly, the particles may comprise dielectric, semiconducting, or metallic materials. The particle composition may depend on the materials of the baseplate 107, the support 109, and the processes performed in the reaction chamber 101. In an embodiment, the particles may comprise, for example, Ti, $Al_2O_3$ and/or $HfO_2$. These particles may be unintentionally transported to the surface of the workpiece W, for example, due to the movement of gases as the support 109 moves towards engaging with or engages the baseplate 107. These particles can contaminate workpiece W, resulting in lower quality and yields of workpieces W.

Workpiece contamination may be reduced by establishing a positive pressure gradient between the reaction chamber 101 and loading chamber 102 during reactor closure, wherein the pressure in the reaction chamber 101 is higher than that in the loading chamber 102. In some embodiments, the control system 113 is configured to control the pressure of the reaction chamber 101 to be higher than that of the loading chamber 102 while the workpiece support 109 is in motion, which can include opening or closing motion. The control system 113 may be configured to control the flow of gas through the inlets 103, 105 and the outlets 104, 106 to ensure the desired direction of flow from reaction chamber 101 to the loading chamber 102 while the support 109 is in motion, and especially during the process of moving towards engaging with or engaging the baseplate 107. Any contact between the support 109 and the baseplate 107 exacerbates the particle generation problem.

Method of Operation

FIGS. 5A-5D illustrate an example of processing a workpiece W in the apparatus 100 of FIG. 1. However, it will be appreciated that the method can be applied to other apparatuses disclosed herein, as well as to other suitable semiconductor workpiece processing apparatuses.

Initial State

In FIG. 5A, the support 109 is in the loading position and the gate valve 112 is closed. In the illustrated embodiment, a plurality of lift pins 111 extend above a portion of the workpiece support 109. In some embodiments, one or more of the inlets 103, 105 and/or the outlets 104, 106 may be opened to allow gases to flow through the reaction chamber 101 and/or the loading chamber 102 prior to loading the workpiece W onto the support 109, such as for purging reaction chamber 101 and/or loading chamber 102.

In some embodiments, the control system 113 may flow purge gas into the reaction chamber 101 through the reaction chamber inlet 103. In some embodiments, the rate of gas flow through the reaction chamber inlet 103 may be between about 0.5 slm and about 2.0 slm. In some embodiments, the rate of gas flow through the reaction chamber inlet 103 may be between about 0.8 slm and about 1.2 slm. In the above embodiments, the rate of gas flow through the reaction chamber inlet 103 may be constant and independent of the pressure in the reaction chamber 101. In some embodiments, the reaction chamber outlet 104 may be connected to a suction mechanism or vacuum pump. It will be understood by a skilled artisan that many different flow rates into reaction chamber 101 may be used, depending on reaction chamber and loading chamber flow rate conductances and pumping speeds, which depend on process conditions.

In some embodiments, the control system 113 may flow purge gas into the loading chamber 102 through the loading chamber inlet 105. The control system 113 may adjust the rate of purge gas flow through the loading chamber inlet 105 in order to maintain a desired pressure, e.g., between about 0.5 Torr and about 1.5 Torr and more particularly 0.8-1.2 Torr, in the loading chamber 102. Notwithstanding the above, in some embodiments, the flow of purge gas through the loading chamber inlet 105 may be controlled by feedback from a pressure sensor located in the loading chamber 102 and having a set-point within the above ranges and/or a flow rate limiter, e.g., set to a maximum of about 1 slm. In some embodiments, the loading chamber outlet 106 may be isolated from a suction mechanism. It will be understood, of course, that in other embodiments, the relative pressures in the reaction chamber 101 and loading chamber 102 may be controlled by pressure controllers (e.g., throttle valve(s)) at the exhaust end of the reaction chamber 101 and loading chamber 102 instead of or in addition to controlling purge gas flow rates directly upstream of the inlets.

In the illustrated embodiment, the reaction chamber 101 is substantially open to the loading chamber 102 when the support is in the loading position. Because the opening 108 allows fluid communication between the reaction chamber 101 and the loading chamber 102 when the support 109 is in the loading position, the pressure between the two chambers will tend to equalize. In embodiments where the flow of purge gas through the loading chamber inlet 105 is controlled by feedback from a pressure sensor, the pressure in the reaction chamber 101 may tend towards the feedback control set-point. Accordingly, in some embodiments, the pressure in the reaction chamber 101 may be approximately equal to, or slightly less than, the ranges supplied above for the loading chamber 102. Specifically, the pressure in the reaction chamber 101 may be between about 0.5 Torr and about 1.5 Torr. In some embodiments, the pressure in the reaction chamber 101 may be between about 0.8 Torr and about 1.2 Torr.

Open Gate Valve

In FIG. 5B, the gate valve 112 has been opened to allow a workpiece W to be loaded onto the support 109. In some embodiments, the workpiece W may be a semiconductor workpiece. As discussed above, if a paddle or fork is used as a robot end effector (not shown), support 109 may comprise lift pins 111, onto which the workpiece W may be placed. The lift pins 111 may be configured to move towards and away from support 109. As such, lift pins 111 and the workpiece W may move toward support 109, or be lowered such that the workpiece W is positioned on the support 109. In some embodiments, lift pins 111 are configured to lower the workpiece W onto support 109 when the support 109 is moved, or raised, towards the processing position. In some embodiments, a vacuum may be applied to draw the workpiece W to the support 109, whereas, in other embodiments, gravity alone keeps the workpiece W in a pocket of the support 109.

In some embodiments, the pressure outside the gate valve 112 (e.g., in a transfer chamber) may be between about 2 Torr and about 4 Torr. In some embodiments, the pressure outside the gate valve 112 may be between about 2.5 Torr and about 3.5 Torr. The pressure in the reaction chamber 101 and the loading chamber 102 will tend to equalize with the pressure outside while the gate valve 112 is open.

Close Gate Valve

After loading the workpiece W on the support 109, the gate valve 112 may be closed. The pressure in the reaction chamber 101 and in the loading chamber 102 may then return to the ranges established before the gate valve 112 was opened. In the illustrated embodiment, because the reaction chamber 101 is open to the loading chamber 102, the pressure in both chambers will return to the pressure control set-point for the loading chamber 102.

Reactor Closure

After the gate valve 112 is closed, the support 109 may be raised into the processing position. In some embodiments, it may take some time (e.g., about 25 seconds) to move the support 109 into the processing position. Workpiece contamination may occur during a reactor closure procedure due to particle generation and movement as described above. In some embodiments, workpiece contamination may be reduced by establishing a positive pressure gradient between the reactor chamber 101 and the loading chamber 102 during reactor closure. In some embodiments, a net gas flow may be created from the reaction chamber 101 into the loading chamber 102 during reactor closure, thus preventing any disturbed particles from entering the reaction chamber 101 where they could settle on and contaminate the workpiece W.

In some embodiments, the control system 113 may be configured to control the pressure of the reaction chamber 101 to be higher than that of the loading chamber 102 during reactor closure. In some embodiments, the pressure may be between about 0.1 Torr and about 3 Torr higher in the reaction chamber 101 than in the loading chamber 102 while the support 109 is in motion, particularly while it is being raised into the processing position. In some embodiments, the pressure may be between about 0.3 Torr and about 2 Torr higher in the reaction chamber 101 than in the loading chamber 102 while the support 109 is being raised into the processing position. The pressure differential between the reaction chamber 101 and the loading chamber 102 may be greater in embodiments where the process module operates at higher pressures, and may be lower where the process module operates at lower pressures. In some embodiments, the pressure may be (in Torr) between about 1.1 times and about 3 times higher in the reaction chamber 101 than in the loading chamber 102. In some embodiments, the pressure may be (in Torr) between about 1.3 times and about 2 times higher in the reaction chamber 101 than in the loading chamber 102.

The pressure differential between the reaction chamber 101 and the loading chamber 102 will tend to increase as the support 109 approaches the opening 108 in the baseplate 107. In one embodiment, the pressure in the reaction chamber 101 may be between about 1 Torr and about 1.6 Torr, more particularly between about 1.2 Torr and about 1.4 Torr, at the start of reactor closure, when the support 109 is in the loading position. In the same embodiment, the pressure in the reaction chamber 101 may be between about 2 Torr and about 4 Torr, more particularly between about 2.5 Torr and about 3.5 Torr, at the end of reactor closure, when the support 109 is engaged with the baseplate 107 and in the processing position. While the reaction chamber 101 is increasing in pressure, the pressure in the loading chamber 102 may remain steady or reduce, e.g., to between about 0.5 Torr and about 1.5 Torr, more particularly between about 0.8 Torr and about 1.2 Torr, during reactor closure.

In some embodiments, the control system may flow purge gas into the reaction chamber 101 through the reaction chamber inlet 103 and out of the loading chamber 102 through the loading chamber outlet 106 while the support 109 is being moved, or raised into the processing position. One way to ensure this direction of flow is to pump gas from the loading chamber 102 while the support 109 is moving. Gas may be pumped from the loading chamber 102 by configuring the loading chamber outlet 106 to be actively connected to the suction mechanism or vacuum source, while reducing or turning off pumping through the reaction chamber outlet 104. Alternatively, or in addition, purge gas supplied through the reaction chamber inlet 103 is flowed at a much greater rate, as a ratio to the reaction chamber volume, than the rate at which purge gas is flowed through the loading chamber inlet 105, as a ratio to the loading chamber volume. In some embodiments, purge gas may flow through the reaction chamber inlet 103 at between about 0.5 slm and about 1.5 slm, more particularly between about 0.8 slm and about 1.2 slm, during reactor closure. The control system 113 may flow purge gas into the loading chamber 102 through the loading chamber inlet 105 during reactor closure, but desirably no gas is flowed into the loading chamber 102 through the loading chamber inlet 105. In some embodiments, the rate of purge gas flow through the reaction chamber inlet 103 may be between about 2 times and about 4 times, more particularly between about 2.5 times and about 3.5 times, the absolute rate of purge gas flow through the loading chamber inlet 105. This corresponds to a ratio of purge gas flow to chamber volume that is higher in the reaction chamber 101 than in the loading chamber 102 by about 80 times to about 160 times, more particularly about 100 times to about 140 times for the illustrated reactor, since the loading chamber 102 has about 40 times the volume of the reaction chamber 101. It will be apparent to those of ordinary skill in the art that a positive pressure gradient, with higher pressure in the reaction chamber 101 than in the loading chamber 102, during reactor closure may be created by other combinations of gas flow through the inlets 103, 105 and the outlets 104, 106.

Processing

In FIG. 5C, the gate valve 112 has been closed and the support 109 has been moved into the processing position. After the support 109 has been moved into the processing position, with the support 109 engaged with the baseplate 107, the workpiece W may be processed in the reaction chamber 101. In some embodiments, processing the workpiece W in the reaction chamber 101 may comprise CVD. In some embodiments, processing the workpiece W in the reaction chamber 101 may comprise ALD. Reaction gases may flow into the reaction chamber 101 through the reaction chamber inlet 103, interact with a workpiece W, and flow out of the reaction chamber 101 through the reaction chamber outlet 104 in a laminar, horizontal, or "cross-flow" arrangement. In some embodiments, inert purge gases such as nitrogen may flow into the loading chamber 102 through the loading chamber inlet 105, and flow out of the loading chamber 102 through the loading chamber outlet 106. For ALD, reaction gases are alternated in pulses separated by periods of purging for self-saturating surface reactions, producing typically less than one monolayer per cycle.

In some instances, it may be desirable to prevent reaction gas from leaking into the loading chamber 102 from the reaction chamber 101 during workpiece processing. Accordingly, a negative pressure gradient may be created between the reaction chamber 101 and the loading chamber 102 during workpiece processing, where the pressure in the loading chamber 102 is greater than the pressure in the reaction chamber 101. In some embodiments, if there is no seal between the support 109 and the baseplate 107, a net gas flow may be created from the loading chamber 102 into the reaction chamber 101 during workpiece processing. As such, a flow of inert gas from loading chamber 102 to reaction chamber 101 during workpiece processing will create a diffusion barrier to prevent the flow of reactants and other processing byproducts into loading chamber 102.

The control system may be configured to control the pressure of the reaction chamber 101 to be lower than that of the loading chamber 102 while the support 109 is in the processing position. In some embodiments, the pressure in the reaction chamber 101 may be between about 0.1 Torr and about 2.5 Torr lower, more particularly between about 0.3 Torr and 1 Torr lower, than that in the loading chamber 102 during workpiece processing. In some embodiments, the pressure in the loading chamber 102 may be (in Torr) between about 1.1 and about 2 times higher than that in the reaction chamber 101 during workpiece processing. For example, the pressure in the reactor chamber 101 may be between about 2.5 Torr and about 4.5 Torr during workpiece processing, while the pressure in the loading chamber 102 may be between about 3 Torr and about 5 Torr during workpiece processing. In some embodiments, the pressure in the reactor chamber 101 may be about 3.5 Torr during workpiece processing, while the pressure in the loading chamber 102 may be about 4 Torr during workpiece processing.

In some embodiments, the control system 113 may flow reaction and/or purge gases into the reaction chamber 101 through the reaction chamber inlet 103 and out of the reaction chamber 101 through the reaction chamber outlet 104 during workpiece processing. As an example, the total gas flow through the reaction chamber inlet 103 may be between about 1 slm and about 1.6 slm, more particularly between about 1.2 slm and about 1.4 slm, during workpiece processing. Typically, the reaction chamber outlet 104 may be connected to a suction mechanism to pump gas from reaction chamber 101 while the workpiece support 109 is in the processing position during workpiece processing.

In some embodiments, the control system 113 may also flow purge gas as a carrier gas into the loading chamber 102 through the loading chamber inlet 105 and out of the loading chamber 102 through the loading chamber outlet 106 during workpiece processing. For example, purge gas may flow through the loading chamber inlet 105 at between about 50 sccm and about 250 sccm, more particularly between about 100 sccm and about 200 sccm, during workpiece processing. With a low purge flow, pumping need not be as strong through the loading chamber outlet 106 during workpiece processing in order to maintain the desired inward pressure differential.

Reactor Opening

After processing the workpiece W in the reaction chamber 101, the support 109 may be lowered into the loading position, as shown in FIG. 5D. In some embodiments, there may be a stabilization period (e.g., less than a minute or about 20-30 seconds) before the support 109 is lowered. It may take about 20 seconds to move the support 109 into the loading position. Workpiece contamination may also occur during a reactor opening procedure, while the support 109 is lowered into the loading position. In some embodiments, workpiece contamination may be reduced by establishing a positive pressure gradient between the reactor chamber 101 and the loading chamber 102 during reactor opening. In some embodiments, a net gas flow may be created from the reaction chamber 101 into the loading chamber 102 during reactor opening. Where the opposite gradient is employed during processing, the purge gas flows and/or pumping levels are altered to return to the desired outward (from reaction chamber to loading chamber) pressure differential.

Thus, the control system may be configured to control the pressure of the reaction chamber 101 to be higher than that of the loading chamber 102 during reactor opening. In some embodiments, the pressure may be between about 0.1 Torr and about 3 Torr higher, more particularly between about 0.3 Torr and about 2 Torr higher, in the reaction chamber 101 than in the loading chamber 102 while the support 109 is being lowered into the loading position. In some embodiments, the pressure may be between about 1.1 times and about 3 times higher, more particularly between about 1.3 times and about 1.2 times higher, in the reaction chamber 101 than in the loading chamber 102.

The pressure differential between the reaction chamber 101 and the loading chamber 102 will tend to decrease as the support 109 moves away from the opening 108 in the baseplate 107. In some embodiments, the pressure in the reaction chamber 101 may be between about 2 Torr and about 4 Torr, more particularly between about 2.5 Torr and about 3.5 Torr, at the start of reactor opening, when the support 109 is in the processing position. The pressure in the loading chamber 102 may be between about 0.5 Torr and about 1.5 Torr, more particularly between about 0.8 Torr and about 1.2 Torr, during reactor opening. By the end of reactor opening, when the support 109 is in the loading position, the pressure in the reaction chamber 101 may be between about 1 Torr and about 1.6 Torr, more particularly between about 1.2 Torr and about 1.4 Torr.

In some embodiments, the control system may flow purge gas into the reaction chamber 101 through the reaction chamber inlet 103 and out of the loading chamber 102 through the loading chamber outlet 106 while the support 109 is being moved, or lowered, into the loading position. In some embodiments, purge gas may flow through the reaction chamber inlet 103 at between about 0.5 slm and about 1.5 slm, more particularly between about 0.8 slm and about 1.2 slm, during reactor opening. In some embodiments, vacuum pumping of gas from the loading chamber 102 through the loading chamber outlet 106 is increased during reactor opening. Vacuum pumping through the reaction chamber outlet 104 can be reduced or isolated.

In alternative embodiments, the control system 113 may additionally flow purge gas into the loading chamber 102 through the loading chamber inlet 105 during reactor opening. However, the rate of purge gas flow through the reaction chamber inlet 103 may be between about 2 times and about 4 times, more particularly between about 2.5 times and about 3.5 times, the rate of purge gas flow through the loading chamber inlet 105. It will be apparent to those of ordinary skill in the art that a positive pressure gradient during reactor opening may be created by other combinations of gas flow through the inlets 103, 105 and the outlets 104, 106.

Unloading

In FIG. 5D, the support 109 has been lowered into the loading position after processing. In some embodiments, one or more of the inlets 103, 105 and/or the outlets 104, 106 may be opened to allow gases to flow through the reaction chamber 101 and/or the loading chamber 102 prior to unloading the workpiece W from the support 109.

In some embodiments, the control system 113 may instruct the continued flow of purge gas into the reaction chamber 101 through the reaction chamber inlet 103. In some embodiments, the rate of gas flow through the reaction chamber inlet 103 may be between about 0.5 slm and about 1.5 slm, more particularly between about 0.8 slm and about 1.2 slm. In some embodiments, the reaction chamber outlet 104 may be connected to a suction mechanism.

At the same time, the control system 113 may flow purge gas into the loading chamber 102 through the loading chamber inlet 105. In some embodiments, the control system 113 may employ feedback from a pressure sensor to adjust the rate of purge gas flow through the loading chamber inlet 105 in order to maintain a desired pressure between about 0.5 Torr and about 1.5 Torr, more particularly between about 0.8 Torr and about 1.2 Torr, in the loading chamber 102. The opening 108 allows fluid communication between the reaction chamber 101 and the loading chamber 102 when the support 109 is in the loading position. Accordingly, in some embodiments, the pressure in the reaction chamber 101 may be approximately equal that of the loading chamber 102. Notwithstanding pressure-feedback control, in some embodiments, the flow of purge gas through the loading chamber inlet 105 may be limited (e.g., to a maximum of about 1 slm) by a flow rate limiter. In some embodiments, the loading chamber outlet 106 may be isolated from vacuum pumping.

The workpiece W may be unloaded through the gate valve 112. In some embodiments, a vacuum may be released such that the workpiece W may no longer be drawn to the support 109. The lift pins 111 may be raised to lift the workpiece W from the support 109, where it may be accessed by a robot end effector. As discussed above, lift pins 111 may be configured to raise, or move workpiece W away from support 109 when the support 109 is moved, or lowered, towards the loading position. In some embodiments, the process may begin again at FIG. 5A for a new workpiece. Two workpieces may simply be exchanged while the gate valve 112 is kept open, instead of performing separate unload and load procedures. It will be understood by those having ordinary skill in the art that the pressure/flow rate ranges discussed above are merely exemplary for a PULSAR 3000™ system, and that a skilled artisan can vary the actual pressure and flow ranges depending on the reactor design.

Flowcharts

Figure 6:
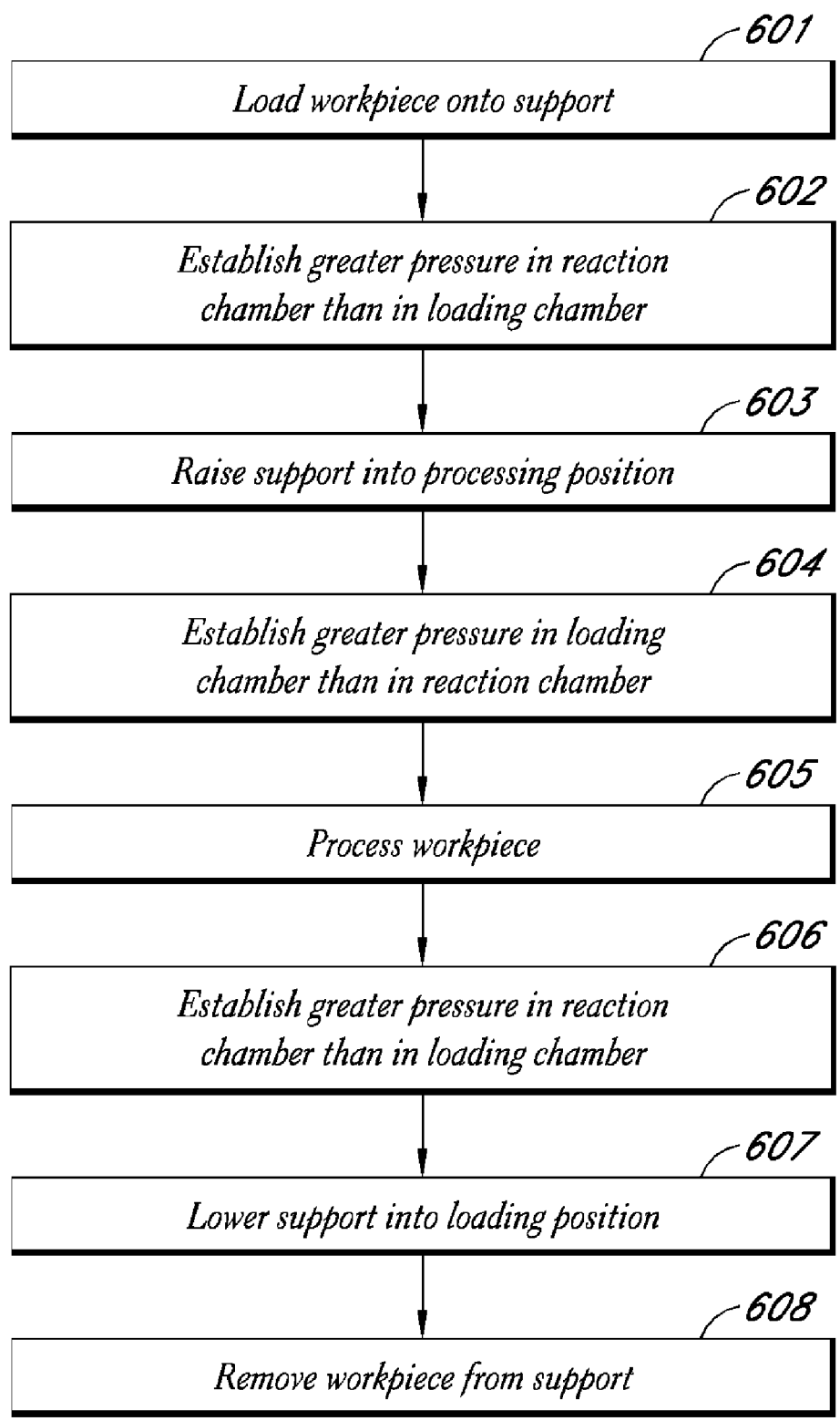
FIG. 6 is a flowchart illustrating a method of processing a workpiece, according to one embodiment.

FIG. 6 is a flowchart summarizing a method of processing a workpiece according to one embodiment. It will be understood that the actions summarized in the flowchart are neither exhaustive nor exclusive, and that additional actions may intervene between those disclosed. Furthermore, not all of the disclosed actions must occur. While the following description refers to the apparatus of FIG. 1, it will be appreciated that the disclosure of FIG. 6 can be applied to other apparatuses disclosed herein, as well as to other suitable semiconductor processing apparatuses.

Referring to FIGS. 1 and 6, according to one embodiment, the workpiece W may be loaded 601 onto the support 109. The control system may then establish 602 greater pressure in the reaction chamber 101 than in the loading chamber 102. This positive pressure gradient may be maintained 603 while the support 109 is raised into the processing position. The control system may then establish 604 greater pressure in the loading chamber 102 than in the reaction chamber 101. This negative pressure gradient may be maintained 605 while the workpiece W is processed in the reaction chamber 101. The control system may then re-establish 606 greater pressure in the reaction chamber 101 than in the loading chamber 102. This positive pressure gradient may be maintained 607 while the support 109 is lowered into the loading position. Finally, the workpiece W may be removed 608 from the support 109.

Figure 7:
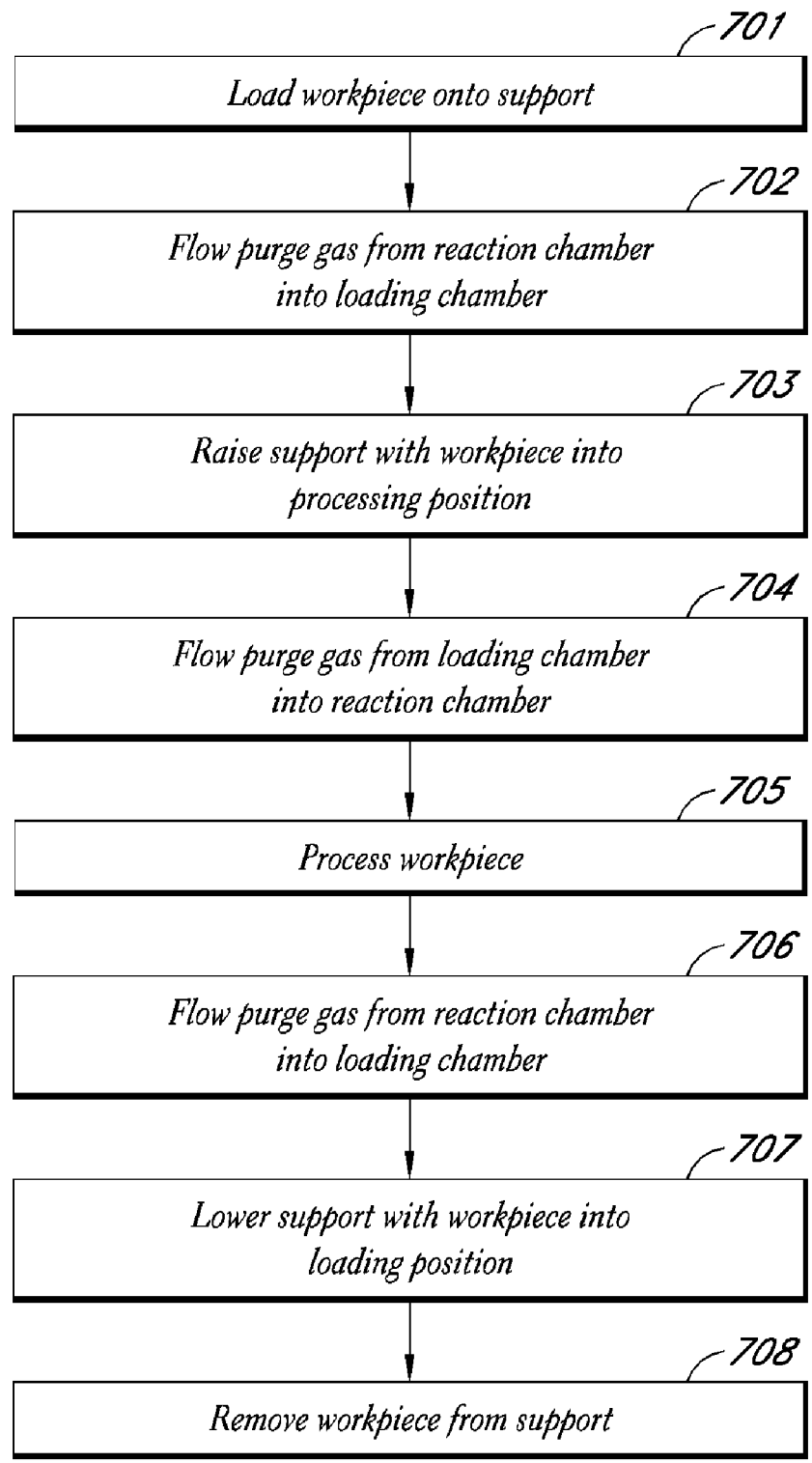
FIG. 7 is a flowchart illustrating a method of processing a workpiece, according to another embodiment.

FIG. 7 is a flowchart summarizing a method of processing a workpiece according to one embodiment. It will be understood that the actions summarized in the flowchart are neither exhaustive nor exclusive, and that additional actions may intervene between those disclosed. Furthermore, not all of the disclosed actions must occur. While the following description refers to the apparatus of FIG. 1, it will be appreciated that the disclosure of FIG. 7 can be applied to other apparatuses disclosed herein, as well as to other suitable semiconductor workpiece processing apparatuses.

Referring to FIGS. 1 and 7, according to one embodiment, the workpiece W may be loaded 701 onto the support 109. The control system may then flow 702 purge gas from the reaction chamber 101 into the loading chamber 102. In some embodiments, the control system may flow purge gas into the reaction chamber 101 through the reaction chamber inlet 103 and out of the loading chamber 102 through the loading chamber outlet 106. This gas flow may comprise pumping gas from the loading chamber 102. This gas flow may be maintained 703 while the support 109 is moved or raised into the processing position. Workpiece contamination may therefore be reduced, as particles generated or stirred during reactor closure may be directed into the loading chamber 102. Once the support 109 is raised into the processing position, there may still be leakage or intentional fluid communication between the reaction chamber 101 and the loading chamber 102. The control system may then flow 704 purge gas from the loading chamber 102 into the reaction chamber 101. In some embodiments, the control system may flow purge gas into the loading chamber 102 through the loading chamber inlet 105 and out of the reaction chamber 101 through reaction chamber outlet 104. This gas flow may comprise pumping gas from the reaction chamber 101. The gas flow may be maintained while the workpiece W is processed 705 in the reaction chamber 101. After processing, the control system may again flow 706 purge gas from the reaction chamber 101 to the loading chamber 102. In some embodiments, the control system may flow purge gas into the reaction chamber 101 through the reaction chamber inlet 103 and out of the loading chamber 102 through the loading chamber outlet 106. This gas flow may be maintained while the support 109 is lowered 707 into the loading position. Finally, the workpiece W may be removed 708 from the support 109.

It will be understood by those having ordinary skill in the art that when the workpiece support 109 is moving or raising to a closed position, and gas flows from the reactor chamber inlet 103 through the loading chamber outlet 106, a lower amount of gas may still flow from the reactor chamber outlet 104. In this example, the gas flow from the reactor chamber inlet 103 through the loading chamber outlet 106 is a predominant flow and the gas flow from the reactor chamber outlet 104 is a minority flow. It will also be understood by those having ordinary skill in the art that when the workpiece support is in a processing position, and gas flows from the loading chamber inlet 105 through the reactor chamber outlet 104, a lower amount of gas may still flow from the loading chamber outlet 106. In this example, the gas flow from the loading chamber inlet 105 through the reactor chamber outlet 104 is a predominant flow and the gas flow from the loading chamber inlet 103 is a minority flow.

Figure 8:
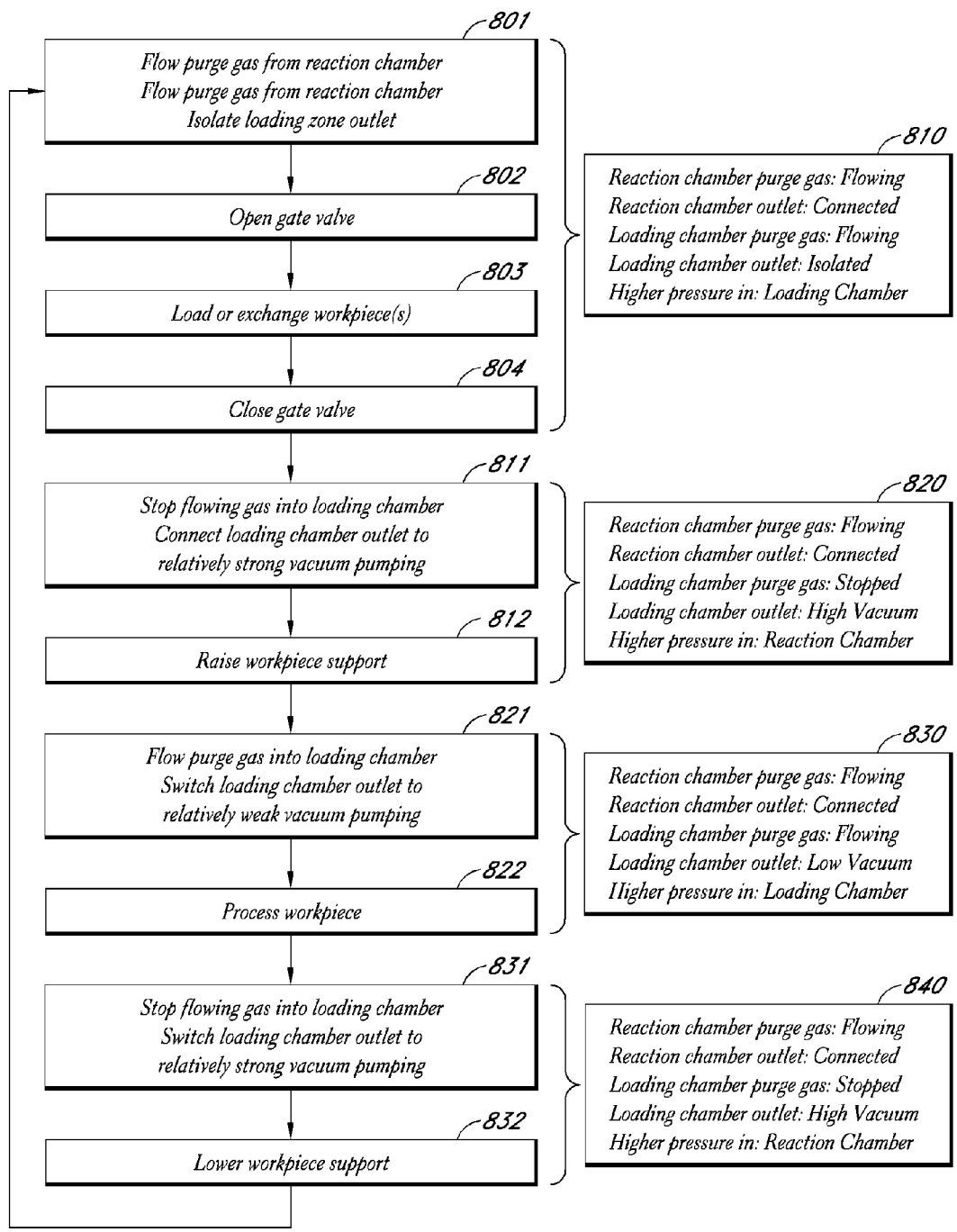
FIG. 8 is a flowchart illustrating a detailed example of a method of processing a workpiece, according to another embodiment.

FIG. 8 is a flowchart illustrating the state of purging and pumping throughout the process during a method of processing a workpiece according to one detailed embodiment. It will be understood that the actions summarized in the flowchart are neither exhaustive nor exclusive, and that additional actions may intervene between those disclosed. Furthermore, not all of the disclosed actions must occur. While the following description refers to the apparatus of FIG. 1, it will be appreciated that the disclosure of FIG. 8 can be applied to other apparatuses disclosed herein, as well as to other suitable semiconductor workpiece processing apparatuses.

Referring to FIG. 8, according to one embodiment, the control system may flow purge gas into the reaction chamber; flow purge gas into the loading chamber; and isolate the loading chamber from vacuum pumping (operational block 801). The gate valve may then be opened 802 and the workpiece may be loaded 803 on the support or exchanged with another workpiece already on the support. The gate valve may then be closed 804. As indicated by status block 810, the status of purging and pumping during execution of operational blocks 801-804 may be as follows: purge gas is flowing into the reaction through its inlet; gas is flowing out of the reaction chamber 101 through its outlet 104, which is connected to vacuum pumping; purge gas is flowing into the loading chamber through its inlet; gas is not flowing out of the loading chamber outlet, which is isolated from vacuum pumping; and there is higher pressure in the loading chamber than in the reaction chamber.

After closing 804 the gate valve, the control system may stop flowing purge gas into the loading chamber such that gas flows out of the loading chamber through its outlet, which may be connected to relatively strong vacuum pumping (operational block 811). The workpiece support may then be raised 812 into the processing position. As indicated by status block 820, the status of purging and pumping during execution of operational blocks 811-812 may be as follows: purge gas is flowing into the reaction chamber through its inlet; gas is flowing out of the reaction chamber through its outlet, which is connected to vacuum pumping; purge gas is not flowing into the loading chamber 102 through the loading chamber inlet 105; gas is flowing out of the loading chamber through its outlet 106, which is connected to strong vacuum pumping; and there is higher pressure in the reaction chamber than in the loading chamber.

After moving, or raising 812 the support into the processing position, the control system may flow purge gas into the loading chamber, and the control system may modify the rate of gas flow out of the loading chamber through its outlet by reducing or isolating the loading chamber outlet 106 from vacuum pumping (operational block 821). The workpiece may then be processed 822 in the reaction chamber. As indicated by status block 830, the status of purging and pumping during execution of operational blocks 821-822 may be as follows: purge and/or reaction gas is flowing into the reaction chamber its inlet; gas is flowing out of the reaction chamber through its outlet, which is connected to vacuum pumping; purge gas is flowing into the loading chamber through its inlet; gas is flowing out of the loading chamber through its outlet, which is connected to a relatively weak suction mechanism; and there is higher pressure in the loading chamber than in the reaction chamber.

After processing 822 the workpiece, the control system may stop flowing purge gas into the loading chamber, and the control system may modify the rate of gas flow out of the loading chamber through its outlet by increasing vacuum pumping (operational block 831). The workpiece support may then be lowered 832 into the loading position, and the above cycle may be repeated. As indicated by status block 840, the status of pumping and purging during execution of operational blocks 831-832 may be as follows: purge gas is flowing into the reaction chamber through its inlet; gas is flowing out of the reaction chamber through its outlet, which is connected to vacuum pumping; purge gas is not flowing into the loading chamber through its inlet; gas is flowing out of the loading chamber through its outlet, which is connected to a relatively strong vacuum pumping; and there is higher pressure in the reaction chamber than in the loading chamber.

Status Chart

FIG. 9 is a chart illustrating the status of a semiconductor processing apparatus after various stages of workpiece processing, according to one embodiment. The semiconductor processing apparatus may be similar to the apparatus 100 that is schematically illustrated in FIG. 1. While the following description refers to the apparatus of FIG. 1, it will be appreciated that the disclosure of FIG. 9 can be applied to other apparatuses disclosed herein, as well as to other suitable semiconductor processing apparatuses, although the details of flow rate and pressure parameters are likely to differ for different reactor designs.

The first column lists different stages of workpiece processing according to one embodiment, which may be similar to those described above. Referring to FIGS. 1 and 9, the stages are: setting initial start conditions, opening the gate valve 112, closing the gate valve 112, establishing a positive pressure gradient between the reactor chamber 101 and the loading chamber 102, raising the support 109, establishing a negative pressure gradient between the reaction chamber 101 and the loading chamber 102, starting the processing of the workpiece W in the reaction chamber 101, reestablishing a positive pressure gradient between the reaction chamber 101 and the loading chamber 102, and lowering the support 109.

The first row lists different aspects of the apparatus 100, according to one embodiment, for which a status is given in the chart. Referring to FIGS. 1 and 9, the aspects are: the approximate rate of gas flow into the reaction chamber 101 through the reaction chamber inlet 103; whether or not the reaction chamber outlet 104 is connected to a suction mechanism; the approximate pressure in the reaction chamber 101; the approximate rate of purge gas flow into the loading chamber through the loading chamber inlet 105; whether or not the loading chamber outlet 106 is connected to vacuum pumping, and the strength of that vacuum pumping; the approximate pressure in the loading chamber 102; the chamber into which net gas flow is directed; the chamber with greater pressure; and the position of the workpiece support 109.

Although this invention has been disclosed in the context of certain embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

What is claimed is:

1. A semiconductor processing apparatus comprising:
   a cross-flow reaction chamber located above a loading chamber, separated by a baseplate including an opening;
   a movable workpiece support configured to hold a semiconductor workpiece;
   a drive mechanism configured to move the workpiece support between a loading position and a processing position;
   a reaction chamber inlet;
   a reaction chamber outlet, wherein the reaction gas inlet is located opposite to the reaction gas outlet, such that reaction gas that flows from the inlet to the outlet travels approximately parallel to a face of the workpiece;
   a loading chamber inlet;
   a loading chamber outlet; and
   a control system configured to control flow through the reaction chamber inlet and outlet and the loading chamber inlet and outlet such that the pressure of the reaction chamber is higher than that of the loading chamber while the workpiece support is moving, and lower than that of the loading chamber while the workpiece support is in the processing position.

2. The apparatus of claim 1, further comprising two or more independently controlled valves configured to allow the regulation of relative pressure and/or the direction of flow between the reaction chamber and the loading chamber.

3. The apparatus of claim 1, wherein the control system is further configured to:
   maintain a purge gas flow through the reaction chamber inlet while the workpiece support is moving; and
   maintain gas flow through the loading chamber outlet while the workpiece support is moving.

4. The apparatus of claim 1, wherein the control system is further configured to:
   maintain a purge gas flow through the loading chamber inlet while the workpiece support is in the processing position; and
   maintain gas flow through the reaction chamber outlet while the workpiece support is in the processing position.

5. The apparatus of claim 1, wherein the workpiece support engages the baseplate opening when the workpiece support is in the processing position.

6. The apparatus of claim 5, wherein a gap exists between the baseplate and the workpiece support when the workpiece support engages the baseplate opening in the processing position.

7. The apparatus of claim 5, wherein a seal exists between the baseplate and the workpiece support when the workpiece support engages the baseplate opening in the processing position.

8. The apparatus of claim 6, wherein the gap provides horizontal spacing between parts of the baseplate and the workpiece support.

9. The apparatus of claim 8, wherein the gap further provides vertical spacing between parts of the support and the baseplate.

10. The apparatus of claim 8, wherein the gap comprises an annular horizontal space substantially surrounding the support.

11. The apparatus of claim 6, further comprising one or more pads configured to space the support from the baseplate.

12. The apparatus of claim 6, wherein the gap is configured to create a substantial barrier to fluid communication between the reaction chamber and the loading chamber.

13. The apparatus of claim 7, wherein the seal comprises a metal-on-metal seal between the baseplate and the support.

14. The apparatus of claim 7, wherein the seal comprises a soft seal between the baseplate and the support.

15. The apparatus of claim 3, wherein the control system is further configured to:
   maintain gas flow through the reaction chamber outlet while the workpiece support is moving; and
   stop gas flow through the loading chamber inlet while the workpiece support is moving.

16. The apparatus of claim 15, wherein the control system is further configured to:
   control the amount of gas pumped from the reaction chamber outlet and the loading chamber outlet, such that the amount of gas pumped from the reaction chamber outlet is less than the amount of gas pumped from the loading chamber outlet while the workpiece support is moving.

17. The apparatus of claim 16, further comprising at least one vacuum pump connected to the reaction chamber outlet, wherein the control system is further configured to isolate the reaction chamber from the vacuum pump while the workpiece support is moving.

18. The apparatus of claim 4, wherein the control system is further configured to:
   maintain gas flow through the loading chamber outlet while the workpiece support is in the processing position; and
   maintain gas flow through the reaction chamber inlet while the workpiece support is in the processing position.

19. The apparatus of claim 18, wherein the control system is further configured to:
   control the amount of gas pumped from the reaction chamber outlet and the loading chamber outlet, such that the amount of gas pumped from the loading chamber outlet is less than the amount of gas pumped from the reaction chamber outlet while the workpiece support is in the processing position.

* * * * *

UNITED STATES PATENT AND TRADEMARK OFFICE
CERTIFICATE OF CORRECTION

PATENT NO. : 8,287,648 B2
APPLICATION NO. : 12/368081
DATED : October 16, 2012
INVENTOR(S) : Joseph C. Reed et al.

It is certified that error appears in the above-identified patent and that said Letters Patent is hereby corrected as shown below:

In the Specification

At Column 5, Line 41, Change "107"." to --107'.--.

In the Claims

At Column 15, Line 59, Delete "gas" and replace it with --chamber--.

At Column 15, Line 60, Delete "gas" and replace it with --chamber--.

Signed and Sealed this
Twenty-ninth Day of October, 2013

Teresa Stanek Rea
*Deputy Director of the United States Patent and Trademark Office*